(12) United States Patent
Kamikawa et al.

(10) Patent No.: US 12,463,033 B2
(45) Date of Patent: Nov. 4, 2025

(54) SEMICONDUCTOR SUBSTRATE, AND MANUFACTURING METHOD AND MANUFACTURING APPARATUS OF SEMICONDUCTOR SUBSTRATE

(71) Applicant: KYOCERA CORPORATION, Kyoto (JP)

(72) Inventors: Takeshi Kamikawa, Kyoto (JP); Yuta Aoki, Kyoto (JP); Kazuma Takeuchi, Kyoto (JP); Katsuaki Masaki, Kyoto (JP); Fumio Yamashita, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 18/038,193

(22) PCT Filed: Oct. 19, 2022

(86) PCT No.: PCT/JP2022/038956
§ 371 (c)(1),
(2) Date: May 22, 2023

(87) PCT Pub. No.: WO2024/084630
PCT Pub. Date: Apr. 25, 2024

(65) Prior Publication Data
US 2024/0136177 A1   Apr. 25, 2024
US 2024/0234137 A9   Jul. 11, 2024

(51) Int. Cl.
*H01L 21/02*   (2006.01)
*H10D 62/10*   (2025.01)
*H10D 62/85*   (2025.01)

(52) U.S. Cl.
CPC .... *H01L 21/0254* (2013.01); *H01L 21/02609* (2013.01); *H01L 21/0265* (2013.01);
(Continued)

(58) Field of Classification Search
CPC ........... H01L 21/0254; H01L 21/02609; H01L 21/0265; H01L 29/0642; H01L 29/0657;
(Continued)

(56) References Cited

U.S. PATENT DOCUMENTS

| | | | | |
|---|---|---|---|---|
| 6,599,362 B2* | 7/2003 | Ashby | ................. | H01L 21/0265 117/106 |
| 6,911,351 B2* | 6/2005 | Kidoguchi | .......... | H01S 5/32341 257/E33.068 |

(Continued)

FOREIGN PATENT DOCUMENTS

JP   2002-289539 A   10/2002
JP   2009-239270 A   10/2009
(Continued)

*Primary Examiner* — Jay C Kim
(74) *Attorney, Agent, or Firm* — Volpe Koenig

(57) ABSTRACT

A template substrate including a first seed region and a growth restricting region that are aligned in a first direction, and a first semiconductor part positioned above the template substrate are provided, the first semiconductor part includes a first base positioned above the first seed region, and a first wing connected to the first base, the first wing facing the growth restricting region with a first void space interposed therebetween, the first wing includes an edge positioned above the growth restricting region, and a ratio of a width of the first void space with respect to a thickness of the first void space in the first direction is equal to or larger than 5.0.

25 Claims, 23 Drawing Sheets

(52) U.S. Cl.
CPC ......... *H10D 62/113* (2025.01); *H10D 62/117* (2025.01); *H10D 62/8503* (2025.01)

(58) Field of Classification Search
CPC ............ H01L 29/2003; H01L 21/0242; H01L 21/02381; H01L 21/0243; H01L 21/02433; H01L 21/02458; H01L 21/02502; H01L 21/0262; H01L 21/02631; H01L 21/02639; H10D 62/113; H10D 62/117; H10D 62/8503; C30B 29/06; C30B 29/20; C30B 29/36; C30B 29/38
See application file for complete search history.

(56) References Cited

U.S. PATENT DOCUMENTS

| | | | | |
|---|---|---|---|---|
| 6,927,149 | B2 * | 8/2005 | Sugahara | H01L 21/0265 438/481 |
| 7,361,576 | B2 * | 4/2008 | Imer | H01L 21/02433 438/479 |
| 7,682,944 | B2 * | 3/2010 | Brandes | H01L 21/0237 257/E21.127 |
| 7,692,198 | B2 * | 4/2010 | Frahm | C30B 23/02 257/E29.013 |
| 7,727,332 | B2 * | 6/2010 | Habel | H01L 21/0262 117/88 |
| 8,148,244 | B2 * | 4/2012 | Baker | H01L 21/02639 438/481 |
| 8,367,520 | B2 * | 2/2013 | Arena | H01L 21/0254 438/459 |
| 8,501,582 | B2 * | 8/2013 | Huang | H10H 20/815 438/429 |
| 8,674,393 | B2 * | 3/2014 | Guo | H01L 33/007 257/99 |
| 9,318,326 | B2 * | 4/2016 | Von Kanel | H01L 21/02381 |
| 9,735,010 | B1 * | 8/2017 | Caimi | H01L 21/02694 |
| 10,707,375 | B2 * | 7/2020 | Sung | H01L 33/24 |
| 10,930,500 | B2 * | 2/2021 | Dasgupta | H01L 21/02521 |
| 11,342,442 | B2 * | 5/2022 | Brueck | H10D 62/85 |
| 11,466,384 | B2 * | 10/2022 | D'Evelyn | H01L 21/02647 |
| 12,051,765 | B2 * | 7/2024 | Kamikawa | H01L 21/02433 |
| 2003/0139037 | A1 | 7/2003 | Kobayashi et al. | |
| 2008/0054292 | A1 | 3/2008 | Guo et al. | |
| 2011/0006343 | A1 | 1/2011 | Hata et al. | |
| 2012/0280243 | A1 * | 11/2012 | Lee | H01L 21/02603 257/E21.09 |
| 2018/0219087 | A1 | 8/2018 | Dasgupta et al. | |
| 2019/0172938 | A1 | 6/2019 | Dasgupta et al. | |
| 2022/0108883 | A1 | 4/2022 | Kamikawa et al. | |
| 2022/0367748 | A1 | 11/2022 | Takizawa | |

FOREIGN PATENT DOCUMENTS

| | | |
|---|---|---|
| JP | 2013-251304 A | 12/2013 |
| JP | 2014-150211 A | 8/2014 |
| JP | 2017-535051 A | 11/2017 |
| WO | 2021/070910 A1 | 4/2021 |
| WO | 2022/181686 A1 | 9/2022 |

* cited by examiner

SEMICONDUCTOR SUBSTRATE, AND MANUFACTURING METHOD AND MANUFACTURING APPARATUS OF SEMICONDUCTOR SUBSTRATE

TECHNICAL FIELD

The present disclosure relates to a semiconductor substrate and the like.

BACKGROUND OF INVENTION

A technique for forming a semiconductor element using GaN (gallium nitride) on a silicon substrate or a sapphire substrate has been developed. However, when a GaN layer is formed on a heterogeneous substrate, threading dislocations are generated from an interface between different materials (an interface between a substrate and a formed film) at a defect density on the order of $10^8$ cm$^{-2}$ on a sapphire substrate and on the order of $10^9$ cm$^{-2}$ on a silicon substrate, thereby deteriorating the characteristics and reliability of devices formed thereon. Thus, an Epitaxial Lateral Overgrowth (ELO) method has been studied as a technique for forming a GaN layer having a low defect density on the heterogeneous substrate. For example, a mask pattern in which a GaN layer does not grow is formed on a base substrate including a heterogeneous substrate and a seed layer (a GaN layer or the like), and the GaN layer is laterally grown on a mask part by using the seed layer exposed in an opening portion without the mask part as a growth starting point, whereby the defect density of the GaN layer on the mask part can be reduced (Patent Document 1). However, when the laterally grown GaN layer comes into contact with the mask part, the flatness of the GaN layer may be deteriorated depending on film-forming conditions.

In Patent Document 2, a semiconductor layer is laterally grown on a void space, and a device layer (semiconductor multilayer film) is also formed on a lower surface (back surface) of the semiconductor layer.

CITATION LIST

Patent Literature

Patent Document 1: JP 2013-251304 A
Patent Document 2: JP 2017-535051 T

SUMMARY

Problem to be Solved

In the technique of Patent Document 2, crystal growth in a lateral direction is slow, which makes it difficult to form a wide nitride semiconductor part.

Solution to Problem

A semiconductor substrate according to the present disclosure includes a template substrate including a first seed region and a growth restricting region that are aligned in a first direction, and a first semiconductor part positioned above the template substrate, in which the first seed region is positioned in an upper side than the growth restricting region, the first semiconductor part includes a first base positioned on the first seed region, and a first wing connected to the first base, the first wing facing the growth restricting region with a first void space interposed between the first wing and the growth restricting region, the first wing includes an edge positioned above the growth restricting region, and a ratio of a width of the first void space in the first direction with respect to a thickness of the first void space is equal to or larger than 5.0.

Advantageous Effect

A wide nitride semiconductor part can be formed.

DESCRIPTION OF EMBODIMENTS

Figure 1:
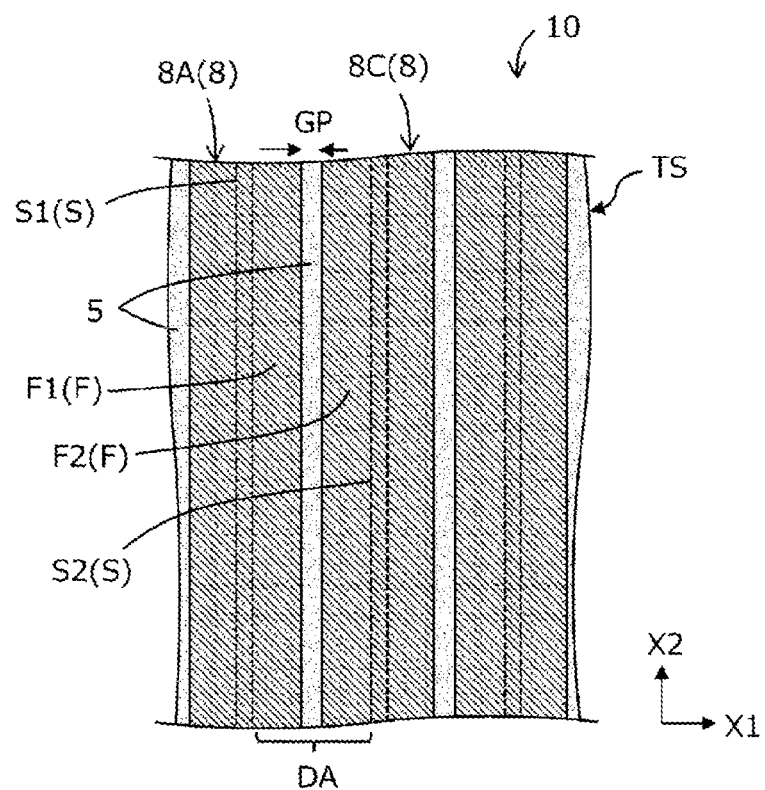
FIG. 1 is a plan view illustrating a configuration of a semiconductor substrate according to the present embodiment.
Figure 2:
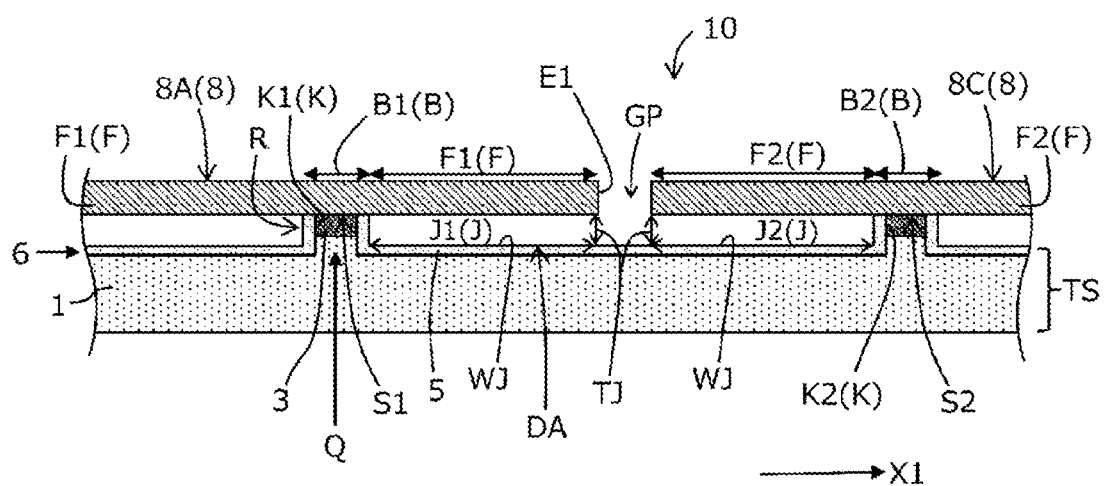
FIG. 2 is a cross-sectional view illustrating the configuration of the semiconductor substrate according to the present embodiment.

FIG. 1 is a plan view illustrating a configuration of a semiconductor substrate according to the present embodiment. FIG. 2 is a cross-sectional view illustrating the configuration of the semiconductor substrate according to the present embodiment. As illustrated in FIG. 1 and FIG. 2, a semiconductor substrate 10 includes a template substrate TS including a first seed region S1 and a growth restricting region DA that are aligned in a first direction X1, and a first semiconductor part 8A positioned above the template substrate TS. The first seed region S1 is positioned in an upper side than the growth restricting region DA. The first semiconductor part 8A includes a first base B1 positioned on the first seed region S1 and a first wing F1 connected to the first base B1. The first wing F1 faces the growth restricting region DA with a first void space J1 interposed between the growth restricting region DA and the first wing F1. The first wing F1 includes an edge E1 positioned above the growth restricting region DA. A ratio of a width WJ of the first void space J1 in the first direction X1 with respect to a thickness TJ of the first void space J1 (an aspect ratio of the void space) is equal to or larger than 5.0.

The template substrate TS may include a mask pattern 6 including a mask part 5 functioning as the growth restricting region DA and a first opening portion K1 functioning as the first seed region S1. Specifically, a surface (upper surface) of the mask part 5 serves as the growth restricting region DA. The template substrate TS may include a main substrate 1 (a heterogeneous substrate) having a different lattice constant from that of the first semiconductor part 8A, and a seed part 3. The template substrate TS may include a ridge part R on the upper surface side, and the first seed region S1 may be positioned on an upper surface of the ridge part R. To be specific, the surface (upper surface) of the seed part 3 serves as the first seed region S1.

The first void space J1 is a space between the growth restricting region DA and the first wing F1. A direction from the main substrate 1 to the first semiconductor part 8A is referred to as an "upward direction". Viewing an object with a line of sight parallel to a normal direction of the semiconductor substrate 10 (including viewing in a perspective manner) is referred to as "plan view". The first seed region S1 (the surface of the seed part 3) and the growth restricting region DA (the surface of the mask part 5) are at different positions in a thickness direction (vertical direction) of the substrate, but may be aligned in the first direction X1 (a direction orthogonal to the thickness direction of the substrate) in plan view.

The first semiconductor part 8A contains a nitride semiconductor as a main constituent. The nitride semiconductor is expressed as, for example, $Al_xGa_yIn_zN$ ($0 \leq x \leq 1$; $0 \leq y \leq 1$; $0 \leq z \leq 1$; $x+y+z=1$). Specific examples of the nitride semiconductor include a GaN-based semiconductor, aluminum nitride (AlN), indium aluminum nitride (InAlN), and indium nitride (InN). The GaN-based semiconductor is a semiconductor containing gallium atoms (Ga) and nitrogen atoms (N). Typical examples of the GaN-based semiconductor include GaN, AlGaN, AlGaInN, and InGaN.

The first semiconductor part 8A may be a doped type (for example, an n-type including a donor) or a non-doped type. The semiconductor substrate means a substrate containing a semiconductor, and the main substrate 1 of the template substrate TS may contain a semiconductor (for example, silicon or silicon carbide), or does not need to include a semiconductor. Examples of the main substrate 1 that does not contain a semiconductor include a sapphire substrate. The main substrate 1 and the seed part 3 may be collectively referred to as a base substrate. The template substrate TS including the base substrate and the mask pattern 6 may be referred to as a growth substrate.

The first direction X1 may be an a-axis direction (<11-20> direction) of the first semiconductor part 8A (nitride semiconductor such as GaN). A second direction X2 may be an m-axis direction (<1-100> direction) of the first semiconductor part 8A. A thickness direction of the semiconductor substrate 10 may be a c-axis direction (<0001> direction) of the first semiconductor part 8A.

The first semiconductor part 8A can be formed by an Epitaxial Lateral Overgrowth (ELO) method with the seed part 3 exposed under the first opening portion K1 serving as a starting point. The base B1 positioned above the first opening portion K1, of the first semiconductor part 8A, serves as a dislocation inheritance part in which a large number of threading dislocations occur, and the first wing F1 positioned above the mask part 5 serves as a low defect part having a lower threading dislocation density than that of the dislocation inheritance part. A second semiconductor part 8C grows in the lateral direction on the mask part 5 with the seed part 3 exposed under a second opening portion K2 serving as a starting point, and the growth is stopped before the second semiconductor part 8C meets the first semiconductor part 8A.

As described above, the edge E1 of the first wing F1 is formed above the growth restricting region DA and an aspect ratio of the first void space J1 (a ratio of a width W1 in the first direction X1 with respect to a thickness H1) is set to be equal to or larger than 5.0. This can rapidly form the first wing F1 having high crystallinity (low defect density) and being wide, and can improve the flatness of the first wing F1. When an upper layer part (device layer) including an active layer is formed on the first semiconductor part 8A, a phenomenon in which a material of the upper layer part wraps around to the back surface of the first wing F1 can be suppressed.

The semiconductor substrate 10 may include the second semiconductor part 8C positioned above the template substrate TS. The template substrate TS may include a second seed region S2 being adjacent to the first seed region S1 with the growth restricting region DA interposed therebetween in plan view. The second seed region S2 is positioned in an upper side than the growth restricting region DA. The second semiconductor part 8C may include a second base B2 positioned on the second seed region S2 and a second wing F2 connected to the second base B2 and facing the growth restricting region DA with a second void space J2 interposed therebetween. The first wing F1 and the second wing F2 may be aligned in the first direction X1 with a gap GP interposed therebetween. The second void space J2 may have a ratio of a width WJ in the first direction X1 with respect to a thickness TJ of 5.0 or more.

In the following description, the first semiconductor part 8A and the second semiconductor part 8C may be collectively referred to as a semiconductor part (semiconductor layer) 8, the first wing F1 and the second wing F2 may be collectively referred to as a wing F, the first base B1 and the second base B2 may be collectively referred to as a base B, the first void space J1 and the second void space J2 may be collectively referred to as a void space J, the first opening portion K1 and the second opening portion K2 of the mask pattern 6 may be collectively referred to as an opening K, and the first seed region S1 and the second seed region S2 may be collectively referred to as a seed region S.

The first wing F1 may have a ratio of a width in the first direction X1 with respect to a thickness of 2.0 or more. Setting the ratio of the width of the first wing F1 with respect to the thickness thereof to be equal to or smaller than ½ causes a deviation between the c-axis direction of the first base B1 and the c-axis direction of a tip end of the first wing F1 to be equal to or smaller than 0.2°. The first wing F1 may have a width being equal to or larger than 7.0 μm in the first direction X1. The width of the first wing F1 in the first direction X1 may be, for example, equal to or larger than 10.0 μm, equal to or larger than 20.0 μm, or equal to or larger than 40.0 μm. The width of the first wing F1 in the first direction X1 is preferably equal to or smaller than 80.0 μm. This reduces the possibility that the semiconductor part 8 may be warped in a substrate direction due to gravity. The thickness of the first wing may be, for example, equal to or smaller than 10.0 μm, equal to or smaller than 5.0 μm, or equal to or smaller than 2.0 μm. As illustrated in FIG. 2, a width of the gap GP may be larger than the thickness of the first void space J1. The ratio of the width of the first wing F1 with respect to the first base B1 may be equal to or larger than 3.0. The first void space J1 may have a thickness being equal to or smaller than 3.0 μm. The thicknesses of the first wing F1 and the first base B1 may be the same. The mask part 5 may have a thickness being equal to or smaller than 1 μm, or equal to or smaller than 50 nm. The seed part 3 may be made of a nitride semiconductor (AlN, AlON, GaN-based semiconductor, or the like) containing $2 \times 10^{18}/cm^3$ or more of argon or oxygen.

As illustrated in FIG. 1, each of the first seed region S1 and the growth restricting region DA may have a shape whose longitudinal direction is a second direction X2 orthogonal to the first direction X1. The main substrate 1 is a silicon substrate, a sapphire substrate, or a silicon carbide substrate, and the first semiconductor part 8A may contain a nitride semiconductor (for example, a GaN-based semiconductor).

As illustrated in FIG. 2, the template substrate TS may have the ridge part R on the upper surface side thereof, and the ridge part R may include the seed part 3. An upper surface of the ridge part R may be constituted by the seed part 3, and a side surface of the ridge part R may be constituted by the mask part 5. That is, the upper surface of the ridge part R may include the seed part 3, and the side surface of the ridge part R may include the mask part 5. The seed part 3 may be provided on the upper surface of the ridge part R, and the side surface of the ridge part R may be constituted by the mask part 5 without the seed part 3. The seed part 3 is locally disposed at the ridge part R and does not need to be disposed under the mask part 5.

The main substrate 1 may include a protruding portion Q on the upper surface side, and the seed part 3 may be positioned on the protruding portion Q. The side surface of the ridge part R does not need to be in contact with the first wing F1. The entire side surface of the ridge part R may face the first void space J1. This reduces a contact area between the ridge part R and the first wing F1, which can reduce the number of defects of the wing F1. The seed part 3 does not need to be disposed under the mask part 5. The nitride semiconductor contained in the first semiconductor part 8A is a GaN-based semiconductor. The first void space J1 may have a ratio of a width with respect to a thickness of 20.0 or more. The first semiconductor part 8A may include a pair of two first wings F1 extending from the first base B1 individually in the first direction X1 and in the opposite direction to the first direction X1.

Figure 3:
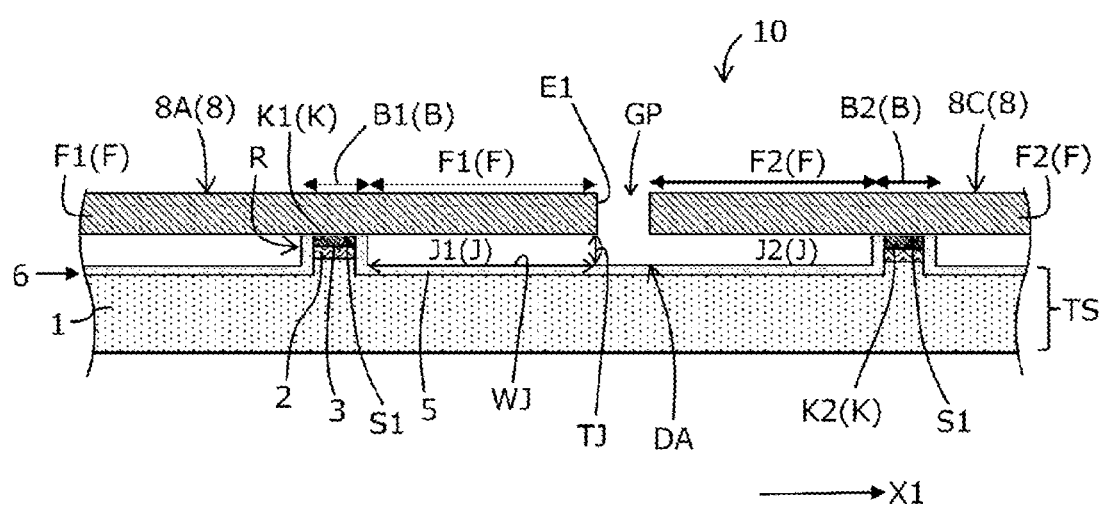
FIG. 3 is a cross-sectional view illustrating another configuration of the semiconductor substrate according to the present embodiment.

FIG. 3 is a cross-sectional view illustrating another configuration of the semiconductor substrate according to the present embodiment. As illustrated in FIG. 3, the ridge part R may include a buffer part 2 and the seed part 3. In this case, an underlying portion constituted by the buffer part 2 and the seed part 3 may be arranged in a stripe shape.

Figure 4:
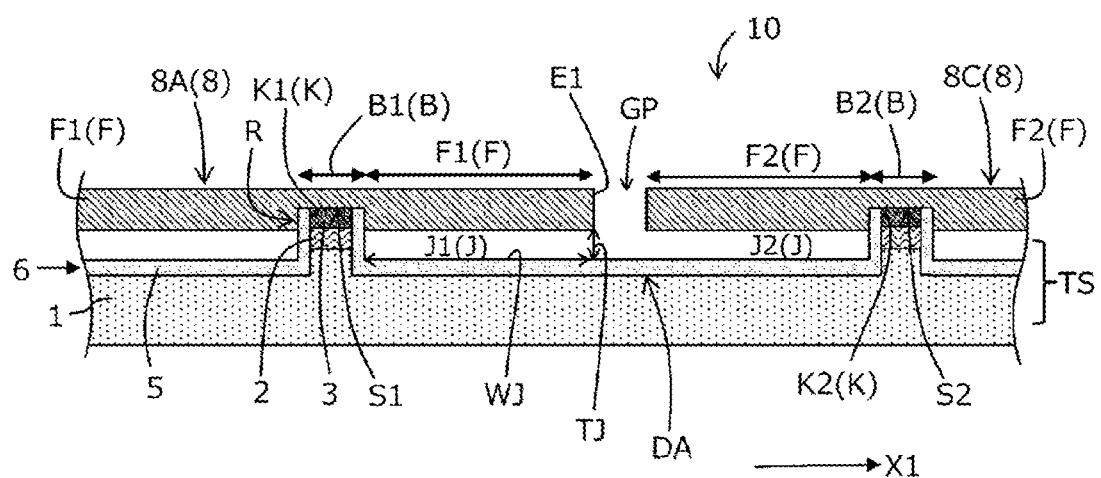
FIG. 4 is a cross-sectional view illustrating another configuration of the semiconductor substrate according to the present embodiment.

FIG. 4 is a cross-sectional view illustrating another configuration of the semiconductor substrate according to the present embodiment. As illustrated in FIG. 4, the first wing F1 may be thicker than the first base B1. The side surface (the mask part 5) of the ridge part R may be in contact with the first wing F1. This is because the void space J1 can be formed as long as the first wing F1 is not in contact with the growth restricting region DA (the mask part 5).

Figure 5:
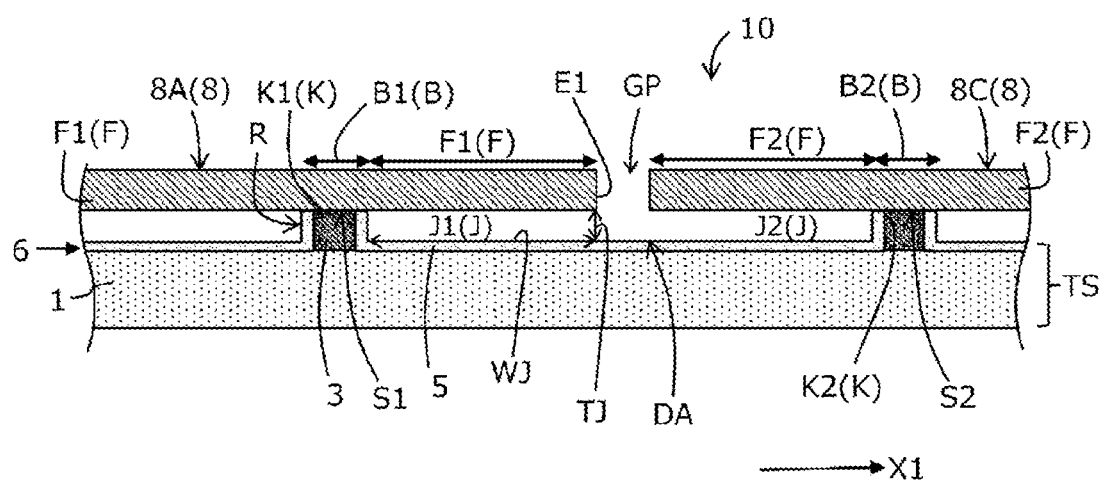
FIG. 5 is a cross-sectional view illustrating another configuration of the semiconductor substrate according to the present embodiment.

FIG. 5 is a cross-sectional view illustrating another configuration of the semiconductor substrate according to the present embodiment. The ridge part R may be positioned on the flat upper surface of the main substrate 1 as illustrated in FIG. 5.

Figure 6:
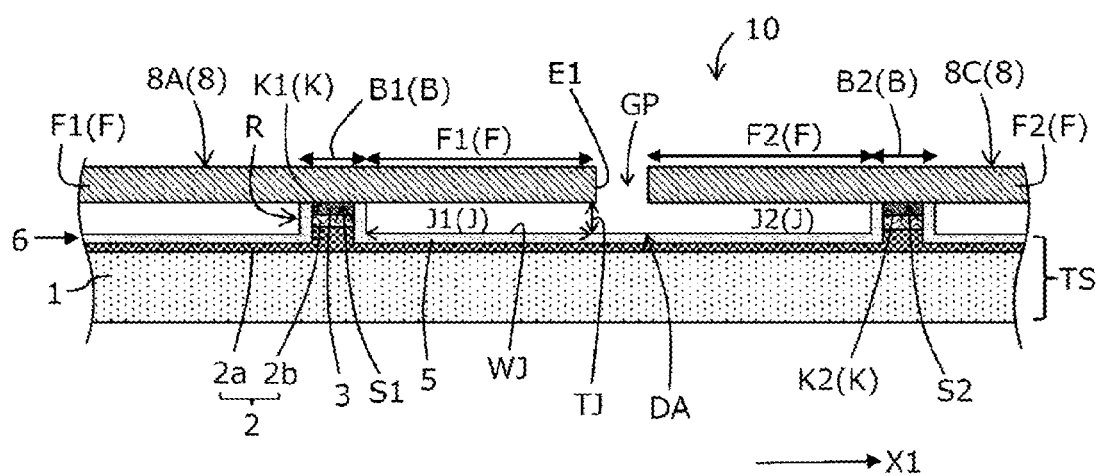
FIG. 6 is a cross-sectional view illustrating another configuration of the semiconductor substrate according to the present embodiment.

FIG. 6 is a cross-sectional view illustrating another configuration of the semiconductor substrate according to the present embodiment. As illustrated in FIG. 6, the buffer part 2 may include a lower part 2a and an upper part 2b, the lower part 2a may have a plane shape, and the seed part 3 and the upper side 2b do not need to be disposed below the mask part 5 but the lower side 2a may be disposed below the mask part 5. The ridge part R may include the upper part 2b of the buffer part 2.

Figure 7:
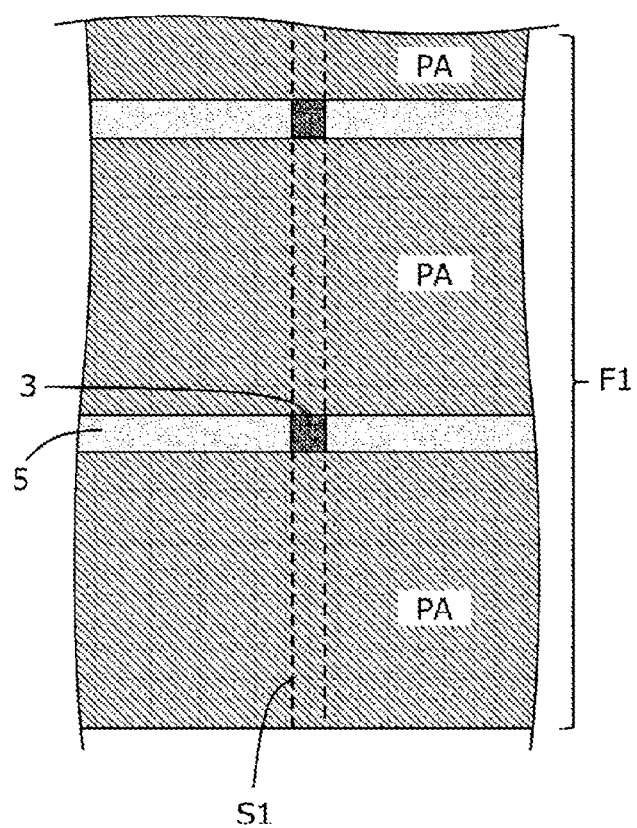
FIG. 7 is a cross-sectional view illustrating another configuration of the semiconductor substrate according to the present embodiment.

FIG. 7 is a cross-sectional view illustrating another configuration of the semiconductor substrate according to the present embodiment. As illustrated in FIG. 7, the first wing F1 may be divided into a plurality of parts PA aligned in the second direction X2 orthogonal to the first direction X1.

Figure 8:
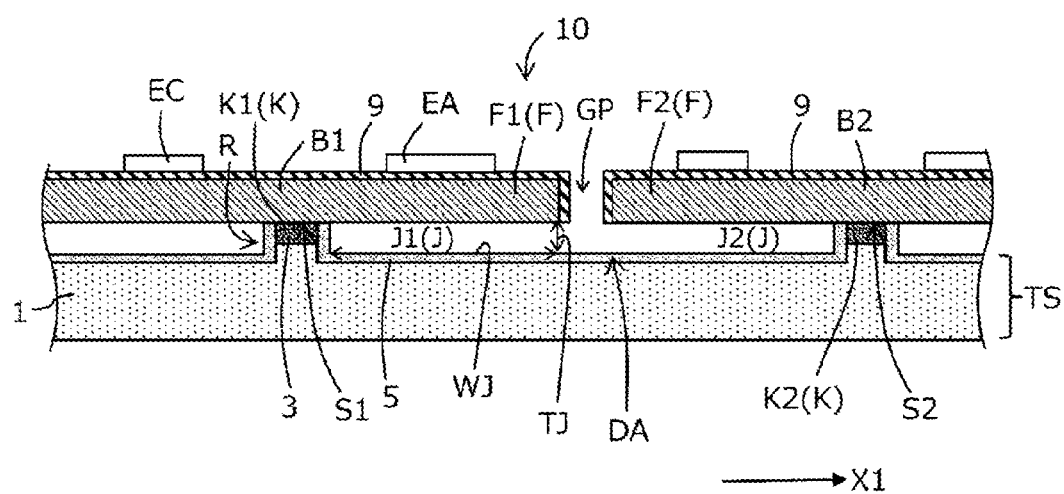
FIG. 8 is a cross-sectional view illustrating another configuration of the semiconductor substrate according to the present embodiment.
Figure 9:
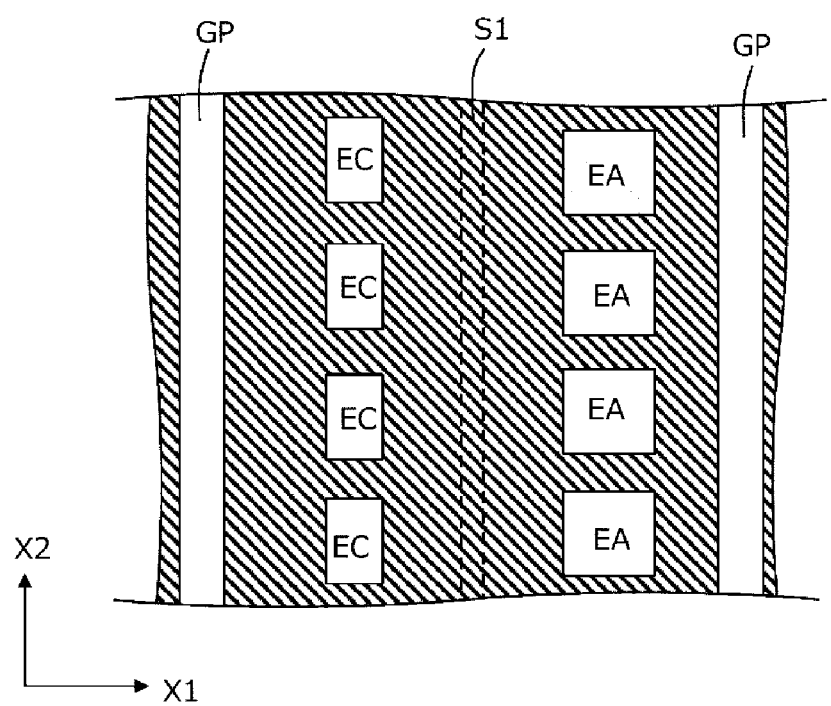
FIG. 9 is a plan view illustrating another configuration of the semiconductor substrate according to the present embodiment.

FIG. 8 is a cross-sectional view illustrating another configuration of the semiconductor substrate according to the present embodiment. FIG. 9 is a plan view illustrating another configuration of the semiconductor substrate according to the present embodiment. As illustrated in FIG. 8 and FIG. 9, the semiconductor substrate 10 may be positioned above the first semiconductor part 8A, and may be provided with an upper layer part 9 including an active layer and a p-type layer. An anode EA and a cathode EC may be provided on the upper layer part 9.

Figure 10:
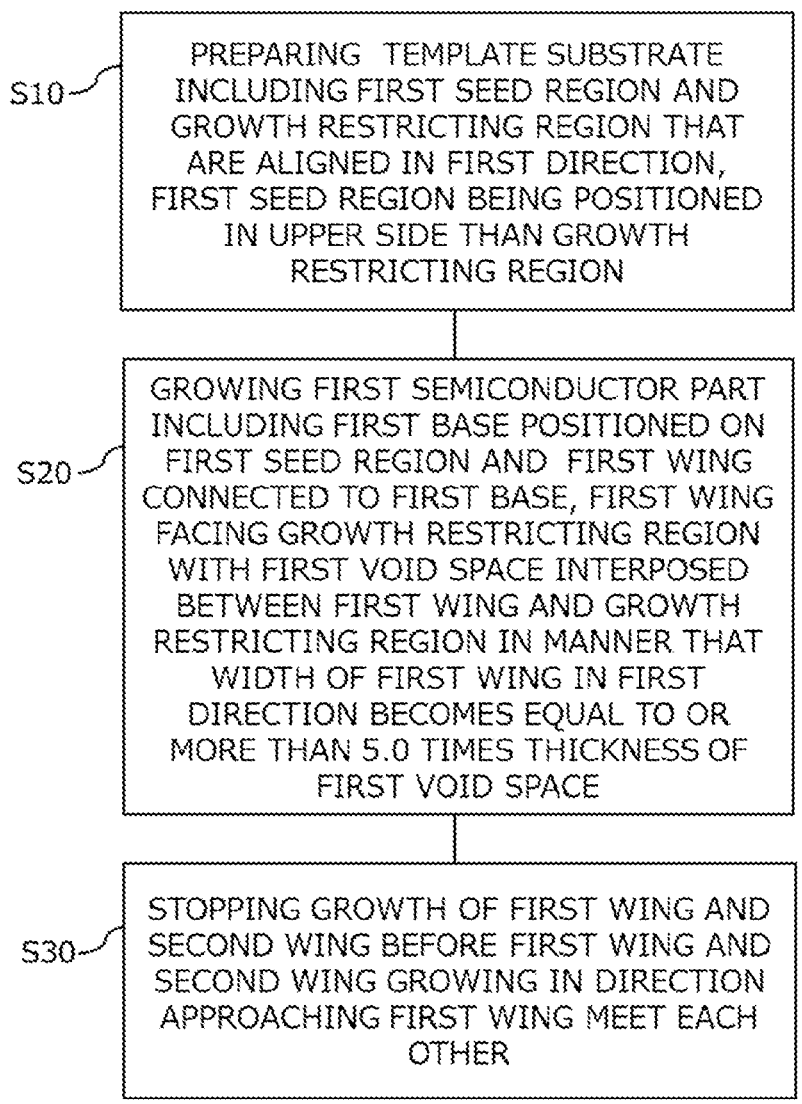
FIG. 10 is a flowchart showing a manufacturing method of a semiconductor substrate according to the present embodiment.

FIG. 10 is a flowchart illustrating a manufacturing method of a semiconductor substrate according to the present embodiment. The manufacturing method of the semiconductor substrate according to the present embodiment includes a step S10 of preparing the template substrate TS including the first seed region S1 and the growth restricting region DA that are aligned in the first direction X1, the first seed region S1 (the surface of the seed part) being positioned in an upper side than the growth restricting region DA, and a step S20 of growing the first semiconductor part 8A in a manner that the width of the first wing F1 in the first direction X1 becomes equal to or more than 5.0 times the thickness of the first void space J1, the first semiconductor part 8A including the first base B1 positioned on the first seed region S1 and the first wing F1 connected to the first base B1, the first wing F1 facing the growth restricting region DA with the first void space J1 interposed between the first wind F1 and the growth restricting region DA. A step S30 of stopping the growth of the first wing F1 and the second wing F2 before the first wing F1 and the second wing F2 growing in a direction approaching the first wing F1 meet each other may be performed. The template substrate TS may include the seed part 3 including the first seed region S1. The seed part 3 may be formed by a sputtering method.

Figure 11:
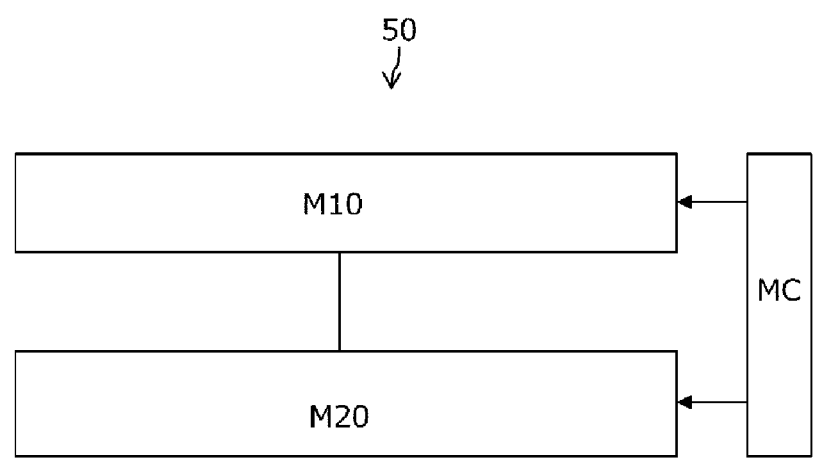
FIG. 11 is a block diagram illustrating a manufacturing apparatus of a semiconductor substrate according to the present embodiment.

FIG. 11 is a block diagram illustrating a manufacturing apparatus of a semiconductor substrate according to the present embodiment. A manufacturing apparatus 50 of a semiconductor substrate includes an apparatus M10 that performs the step S10 in FIG. 10, an apparatus M20 that performs the step S20 in FIG. 10, and a control device MC that controls the apparatus M10 and the apparatus M20. The apparatus M20 may be an MOCVD apparatus, and the control device MC may perform the step S30 via the apparatus M20.

Example 1

As the main substrate 1, a silicon substrate, a silicon carbide substrate (4H-SiC, 6H-SiC substrate), a sapphire substrate, a nitride substrate (GaN, AlN substrate or the like), a ScMgAlO substrate, or the like can be used.

The seed part 3 is formed above the main substrate 1 and serves as a starting point from which the semiconductor part 8 grows. The seed part 3 may be formed in at least a part of the opening portion K (of the mask pattern 6), and may have a plane shape or a pattern shape (for example, a stripe shape). As the seed part 3, a GaN layer, an AlN layer, an AlGaN layer, an AlInN layer, AlGaInN, Al, or the like formed at a low temperature (a temperature being equal to or lower than 500° C.) may be used. The thickness of the seed part 3 is approximately 10 nm to 500 nm.

The buffer part 2 may be formed between the main substrate 1 and the seed part 3 (for example, a GaN layer). The buffer part 2 improves crystallinity and flatness of the seed part 3. The buffer part 2 may have a plane shape or a pattern shape (for example, a stripe shape) corresponding to the seed part 3. As the buffer part 2, a GaN layer, an AlN layer, an AlGaN layer, an AlInN layer, AlGaInN, Al, or the like formed at a low temperature (a temperature being equal to or lower than 500° C.) may be used. The thickness of the buffer part 2 is approximately 10 nm to 500 nm. When a silicon substrate is used as the main substrate 1, it is desirable that the buffer part 2 being in contact with the silicon substrate does not contain gallium in order to suppress melt back.

A layer between the main substrate 1 and the semiconductor part 8 may be referred to as an underlying layer (including the buffer part 2 and/or the seed part 3). A GaN layer may be formed as the underlying layer (for example, the seed part 3) by a sputtering method. In this case, for example, a sputtering target containing gallium nitride as a main constituent (containing gallium in an amount of 25 atm % or more) and containing an oxygen content of 5 atm % or less may be used. A sputtering gas pressure may be set to be less than 0.3 Pa. As the sputtering method, DC sputtering, RF sputtering, AC sputtering, DC magnetron sputtering, Electron Cyclotron Resonance (ECR) sputtering, RF magnetron sputtering, a Pulse Sputter Deposition (PSD) method, a laser ablation method, or the like can be selected as appropriate.

In order to enhance the crystallinity of the entire film, the sputtering target to be used may have an oxygen content of 5 atm % or less, 3 atm % or less, or 1 atm % or less. The purity is also desirably as high as possible, and a content of metal impurities may be less than 0.1% or less than 0.01%.

When a GaN layer is formed by a sputtering method, effects such as surface flatness, improvement in crystallinity, and suppression of generation of surface hillocks (protrusions) can be obtained by using a gallium nitride target containing a low oxygen content.

When a nitride semiconductor (AlN, GaN, or the like) is formed by sputtering as the underlying layer, a vacuum degree in the apparatus before the film formation may be set to be equal to or smaller than $3\times10^{-5}$ Pa, or equal to or smaller than $1\times10^{-5}$ Pa. An underlying substrate (a main substrate, a main substrate with a buffer, or the like) may be subjected to pretreatment before the film formation to remove an organic layer or unevenness on the surface of the underlying substrate, thereby enabling epitaxial growth. Specific examples of the pretreatment include a reverse sputtering treatment, an acid treatment, and a UV treatment, and the reverse sputtering treatment is preferable from the viewpoint of avoiding reattachment of impurities or the like after the treatment. The reverse sputtering treatment is a method in which atoms turned into plasma are caused to collide with a base substrate side to clean the surface of the underlying substrate. The substrate temperature during the film formation may be set to a room temperature. However, performing the film formation with the substrate being heated (for example, 400° to 1000°) can improve the film quality.

An electrical power density during discharge may be equal to or smaller than 5 W/cm$^2$ or equal to or smaller than 1.5 W/cm$^2$. The lower limit of the electrical power density may be 0.1 W/cm$^2$ or 0.3 W/cm$^2$. The electrical power density is obtained by dividing the electrical power to be applied during discharge by an area of the sputtering target. When the electrical power density is too high, a raw material may be sputtered from the target in a clustered state.

In Example 1, the underlying layer (for example, the seed part) being a GaN layer was formed by an RF sputtering method. The gallium nitride target (the oxygen content: 0.4 atom %) was used, a film-forming pressure was set to 0.1 Pa, and 20 to 40 sccm of nitrogen gas was introduced. Although argon gas was not used in Example 1, of course, argon gas may be introduced. A discharge density was 125 W/cm$^2$, and a film-forming temperature was a room temperature.

When the underlying layer (including the buffer part 2 and/or the seed part 3) is formed by using a sputtering method, a laser ablation method, or the like, an internal stress can be controlled from a compressive stress to a tensile stress depending on the film-forming conditions, which enables a stress to be applied to the semiconductor part 8 to be controlled. The internal stress can also be controlled by an amount of argon to be taken into the underlying layer. The stress to be applied to the semiconductor part 8 may be controlled by locally forming the underlying layer (in a pattern shape) on the underlying substrate.

The mask pattern 6 is formed on the base substrate by using a material that restricts longitudinal growth (growth in the c-axis direction) of the nitride semiconductor, and achieves lateral growth (for example, growth in the a-axis direction). The opening portion K (an exposed part of the seed part 3) of the mask pattern 6 serves as a growth starting point of the semiconductor part 8. Examples of the material of the mask part 5 of the mask pattern 6 include silicon nitride, silicon carbide, silicon carbonitride, diamond-like carbon, silicon oxide, silicon oxynitride, and the like, titanium nitride, molybdenum nitride, tungsten nitride, tantalum carbide, and the like, which do not contain silicon, and high melting point metals (molybdenum, tungsten, platinum, and the like). The mask part 5 may be a single layer film made of one of these materials, or a multi-layer film obtained by combining a plurality of these materials. A thickness of the mask part 5 may be approximately 5 nm to 2 μm.

Figure 12:
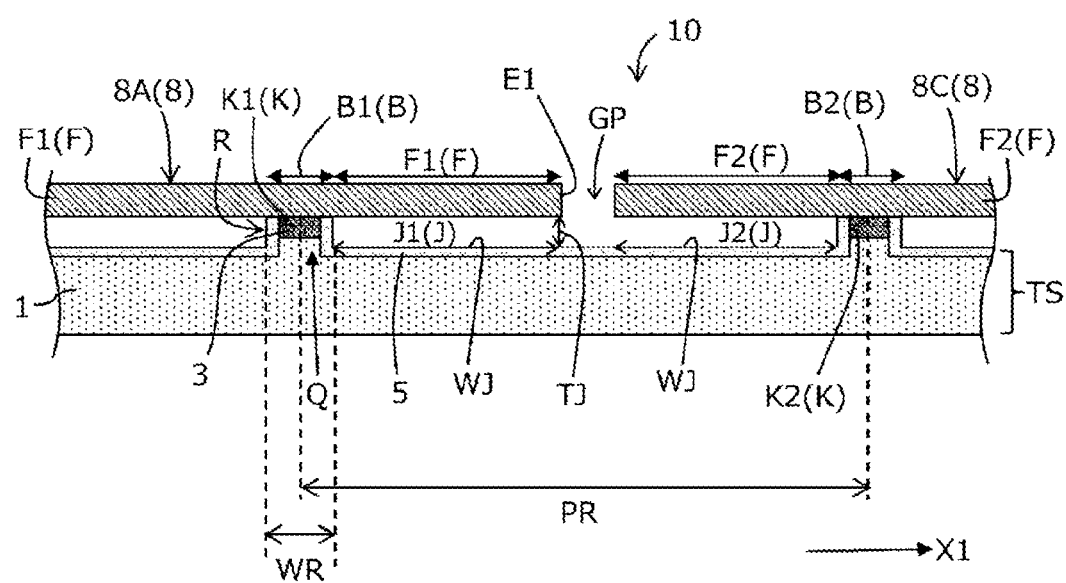
FIG. 12 is a cross-sectional view illustrating a configuration of a semiconductor substrate according to Example 1.

FIG. 12 is a cross-sectional view illustrating the configuration of the semiconductor substrate according to Example 1. In FIG. 12, a silicon substrate is used as the main substrate 1, and the seed part 3 is formed on a part of the upper surface of the main substrate 1. The ridge part R including the seed part 3 and the main substrate 1 is formed in a stripe shape. The mask part 5 is formed on the side surface of the ridge part R and the surface of the main substrate 1. The mask pattern 6 includes the first opening portion K1 at least a part of the upper surface of the ridge part R. The first semiconductor part 8A is formed on the first opening portion K1, and the first void space J1 is positioned under the first wing F1. In other words, the first wing F1 is separated from the mask part 5 (growth restricting region DA). The width WJ of the first void space J1 is a distance in the first direction X1 from the side surface of the ridge part R to the edge E of the first semiconductor part 8A. The thickness (height) TJ of the first void space is a distance from the upper surface of the mask part 5 to the lower surface (back surface) of the first semiconductor part 8A. A ridge width WR was 5 μm and a pitch width PR of the ridge was 55 μm.

Figure 13:
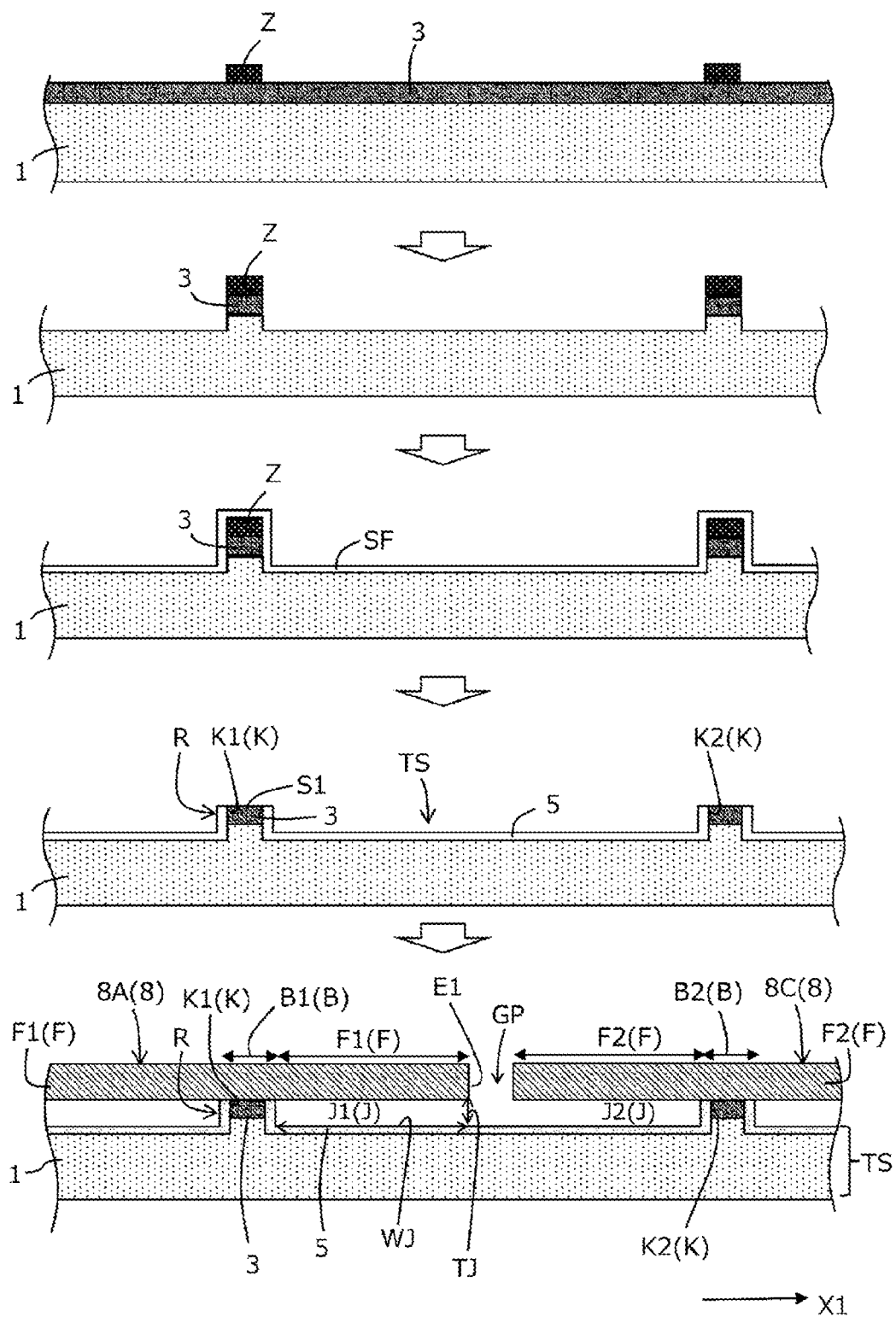
FIG. 13 is a cross-sectional view illustrating a manufacturing method of a semiconductor substrate according to Example 1.

FIG. 13 is a cross-sectional view illustrating a manufacturing method of a semiconductor substrate according to Example 1. The semiconductor substrate of Example 1 can be manufactured as follows. A silicon substrate (S1 (111) plane) is used for the main substrate 1, and an AlN film (the seed part 3) is formed on the silicon substrate by a sputtering method. Using parallel planar type sputtering, magnetron sputtering, pulse sputtering, or the like as the sputtering method makes it possible to form a film at a low temperature and low cost. Note that using an MOCVD method makes it possible to form an AlN film having high crystallinity.

The thickness of the seed part 3 is 100 nm. Silicon and gallium may react with each other at a high temperature (so-called melt back). In order to suppress this problem, the thickness of the seed part 3 may be set to 50 to 500 nm.

A film-forming temperature of the seed part 3 was 400° C., mixed gas of argon gas and nitrogen gas (in which a gas ratio was about 1:1) was used, an input electrical power was 500 W, and a back pressure during film formation was 0.3 Pa. When the sapphire substrate is used, a film of AlN is directly formed. However, when an AlN layer is film-formed on the silicon substrate, an Al layer (the buffer part 2) having a thickness of about several nm is formed first, and then the AlN layer is formed. Thus, the AlN layer with high quality can be formed without nitriding the silicon substrate. In the formation of the Al layer, an Al target is sputtered only with Ar gas (without introducing nitrogen). This makes it possible to continuously form the Al layer and the AlN layer without putting the substrate in and out of the same chamber. Note that when the Al layer and the AlN layer are formed by using the MOCVD apparatus, only TMA (trimethyl aluminum) is first introduced to form the Al layer of several nm on the silicon substrate, and then NH3 is introduced to obtain a layered structure of the S1 substrate/the Al layer/the AlN layer.

Then, a resist Z having a stripe shape and having a width of about 3 μm is formed over the seed part 3 by using a photolithography process, and the ridge part R is formed by using a dry etching process. At this time, a part of the seed part 3 and a part of the main substrate 1 are etched. For example, when the ridge part R is formed by setting an etching thickness of the seed part 3 (the AlN layer) to about 100 nm and an etching thickness of the main substrate to about 300 nm, a ridge height becomes about 400 nm. Here, the resist Z is not removed, and a silicon nitride film SF (for example, 10 nm) serving as the mask part 5 is formed on the resist Z.

When the ELO layer is in contact with the mask part (growth restricting region), the mask part needs to have a thickness of at least 100 nm, and the mask part and the ELO layer may interfere with each other to impair the surface flatness of the ELO layer. However, in Example 1, since the wing F floats in midair and does not come into contact with the mask part 5, significantly thinning the mask part 5 in such a manner cannot limit the growth of the wing F. Thinning the mask part 5 improves the flatness of the back surface of the wing F. Setting the thickness of the mask part 5 to be equal to or less than 50 nm improves the flatness. The thickness thereof can be set to be equal to or less than 30 nm.

Then, the resist Z is removed and the silicon nitride film SF on the ridge part R is lifted off. After that, the first opening portion K1 is formed, which forms the template substrate TS (a selective growth substrate). In this way, manufacturing the template substrate TS without using the MOCVD method achieves significant cost reduction, and an industrial advantage is very large.

When the AlN layer (underlying layer) is film-formed by the sputtering method, Ga does not adhere to the surface of the silicon substrate. When the film of the AlN layer is formed by the MOCVD apparatus used for film formation of the GaN layer, Ga in a furnace may adhere to the surface of the silicon substrate and melt back may occur in a temperature increasing process before the film formation, which causes a problem of a decrease in yield. Thus, maintenance of the MOCVD apparatus (for example, cleaning of components inside the apparatus such as a tray and a cover, or the like) needs to be frequently performed, which causes high cost. On the other hand, the present example is a method in which the semiconductor part 8 is formed by using the MOCVD apparatus and the AlN layer (underlying layer) and the mask layer are formed by using a sputtering apparatus different from the MOCVD apparatus. Thus, upon the introduction into the MOCVD apparatus, AlN (the underlying layer) and the mask part covers the surface of the silicon substrate, which does not cause a decrease in yield. Due to this, an industrial advantage is very large.

Then, the template substrate TS is transferred into the MOCVD apparatus, and the semiconductor part 8 is formed on the template substrate TS by an ELO method. In Example 1, the semiconductor part 8 was a GaN layer, a growth temperature was 1000 to 1200 degrees, a V/III ratio was 500 to 20000, and a growth pressure was 50 kPa. Note that in order to make the semiconductor part 8 be an n-type, doping may be performed by flowing $SiH_4$. When a material containing Si such as $SiO_2$ or SiN is used for the mask part without introducing $SiH_4$, Si doping can be performed with Si evaporated therefrom. The film-forming conditions are preferably set in at least two stages. In the first stage, a film-forming temperature is set to about 1030° C., V/III is set to about 2000, and a growth nucleus (vertical growth part) of the ELO layer (semiconductor part 8) is formed on the opening portion K. A thickness (height) of the growth nucleus may be about 0.2 to 3.0 μm, and a width thereof may be about the same as the width of the ridge part R or may have a size slightly protruding in the a-axis direction (<11-20> direction). In the second stage, the film-forming temperature was raised by about 100° C. to grow the GaN layer in the lateral direction (a-axis direction) from the growth nucleus, and the growth was stopped when a width of the gap GP between the semiconductor parts 8 (GaN layers) growing in the directions opposite to each other on the void space reached a specified value (equal to or less than 10 μm). The semiconductor substrate 10 obtained as described above (where the semiconductor part 8 is exposed) may be taken out from the MOCVD apparatus and stocked, or subsequently, an upper layer part including an active layer and the like may be formed in the MOCVD apparatus.

In Example 1, the fact that even when the crystallinity on the opening portion K is poor, the poor crystallinity is hardly inherited to the wing F on the void space (above the mask part), and the crystallinity of the wing F is increased (the defect density is significantly reduced) was understood. Note that when the nitride semiconductor layer is formed on the seed layer formed by the sputtering method without using the ELO method, defects of the seed layer are entirely inherited to the nitride semiconductor layer, which makes it difficult to obtain a device with high quality.

Figure 14:
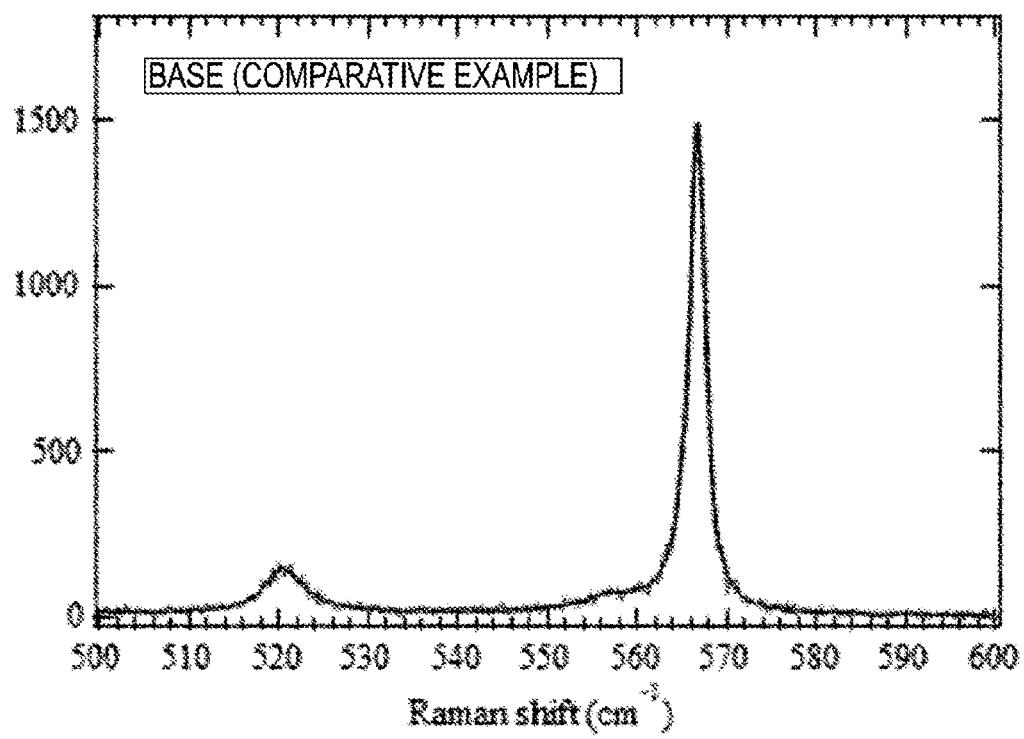
FIG. 14 is Raman spectra of a base and a wing of an ELO layer according to a comparative example.
Figure 14:
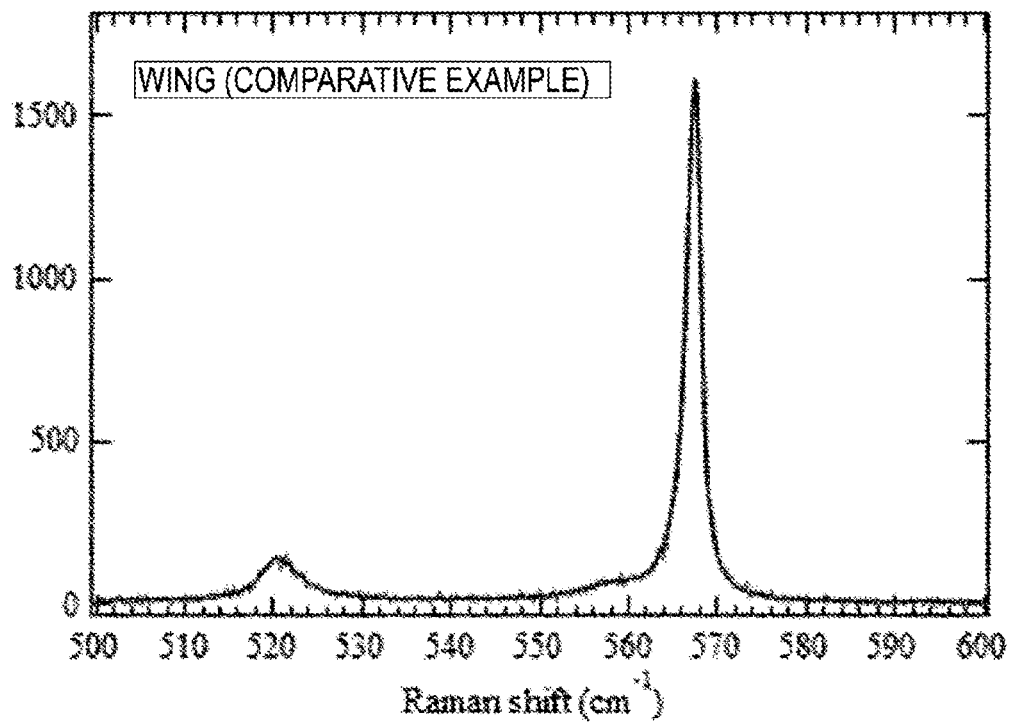
Figure 15:
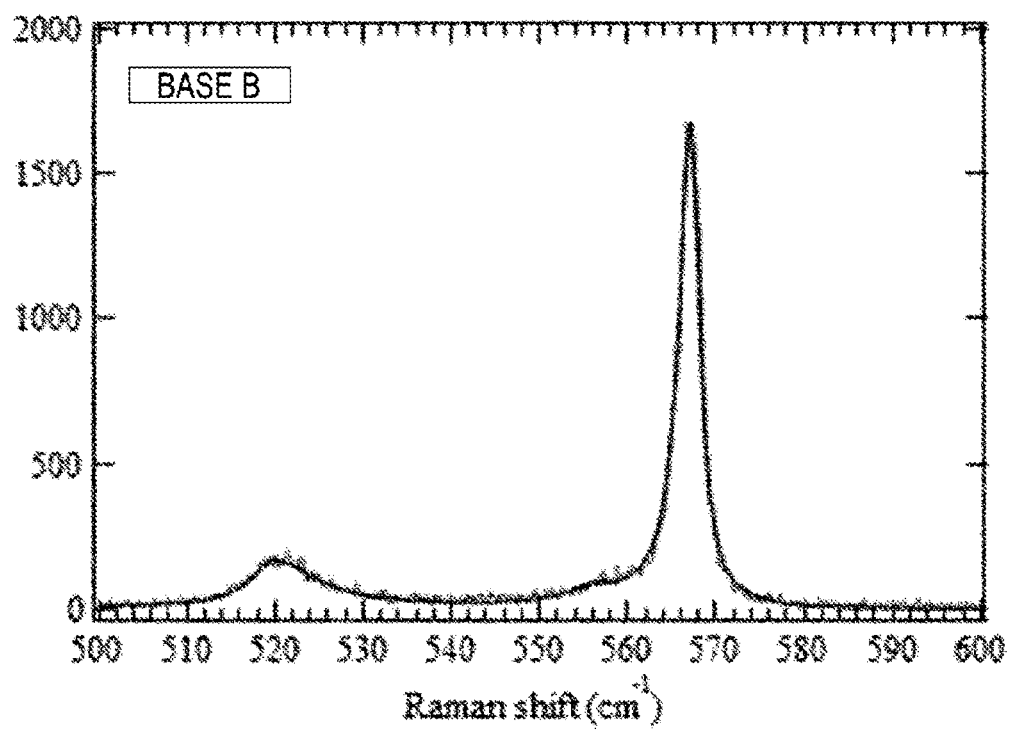
FIG. 15 is Raman spectra of a base and a wing of an ELO layer (semiconductor part) according to Example 1.
Figure 15:
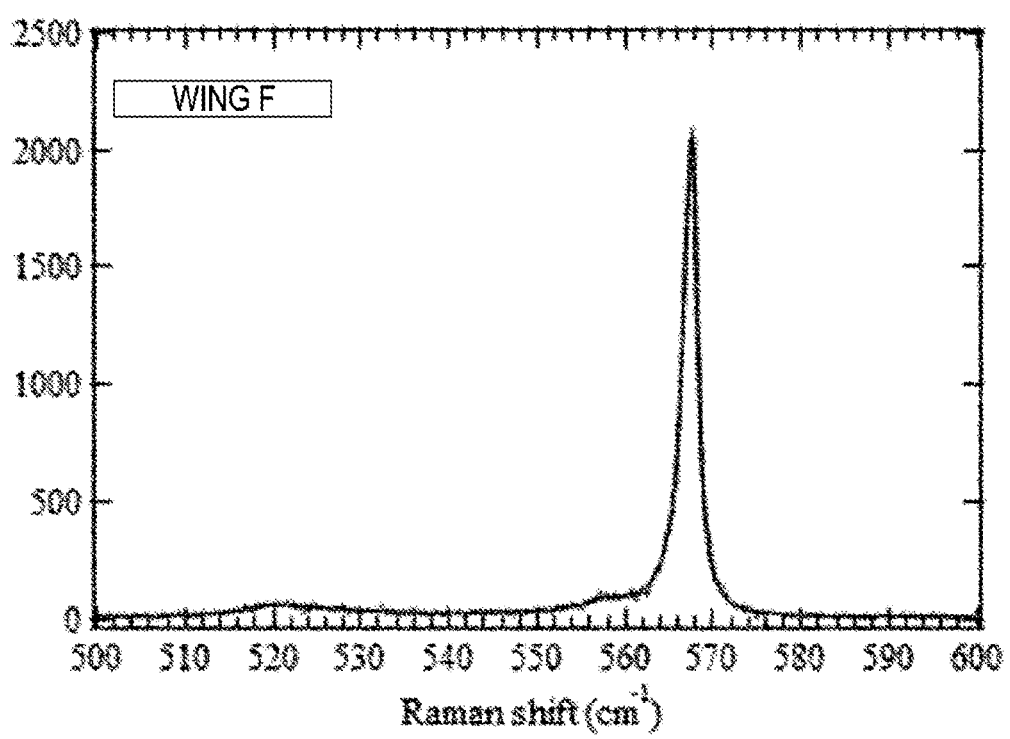

FIG. 14 is Raman spectra of a base and a wing of an ELO layer according to a comparative example. The ELO layer according to the comparative example is formed on a seed layer formed by an MOCVD method. FIG. 15 is Raman spectra of the base and the wing of the ELO layer (semiconductor part) according to Example 1. The seed layer is formed by a sputtering method. From FIG. 14, in the comparative example, the fact that the half-value width of the spectrum of GaN in the base was 2.2 cm$^{-1}$, and the half-value width of the spectrum of GaN on the wing was 2.0 cm$^{-2}$ was found. From FIG. 15, in Example 1, the fact that the half-value width of the spectrum of GaN in the base was 2.8 cm$^{-1}$, the half-value width of the spectrum of GaN on the wing was 2.0 cm$^{-1}$, and the wing was a crystal with significantly high quality that was not different from that in the comparative example (in which the seed part was formed by the MOCVD method) was found. This is an industrially very significant discovery. This is because the semiconductor part with high quality can be obtained by using the template substrate with low cost including the silicon substrate that is inexpensive and the underlying part (the seed part or the layered part of the buffer part and the seed part) formed by using a non-MOCVD apparatus such as a sputtering apparatus or an EB apparatus.

Regarding the upper layer part 9 (device layer) formed on the semiconductor part 8, by forming at least an active region (for example, a light emitting region) above the wing, an element with significantly high quality can be manufactured. Example 1 also has an advantage that the template substrate TS can be formed without using the MOCVD apparatus, and the semiconductor part 8 and the upper layer part 9 can be continuously formed by the MOCVD apparatus.

Figure 16:
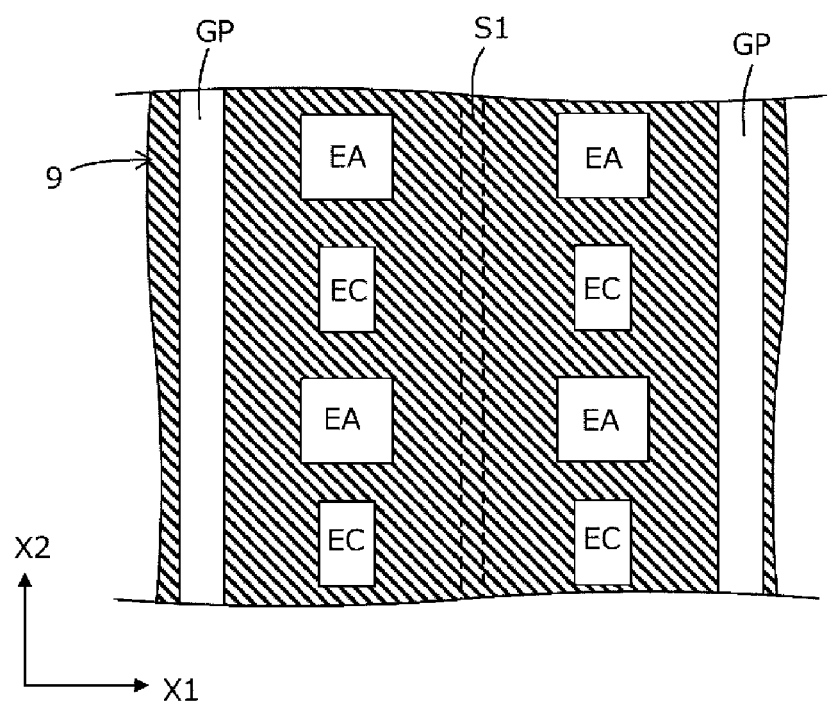
FIG. 16 is a plan view of a semiconductor substrate including an upper layer part.
Figure 17:
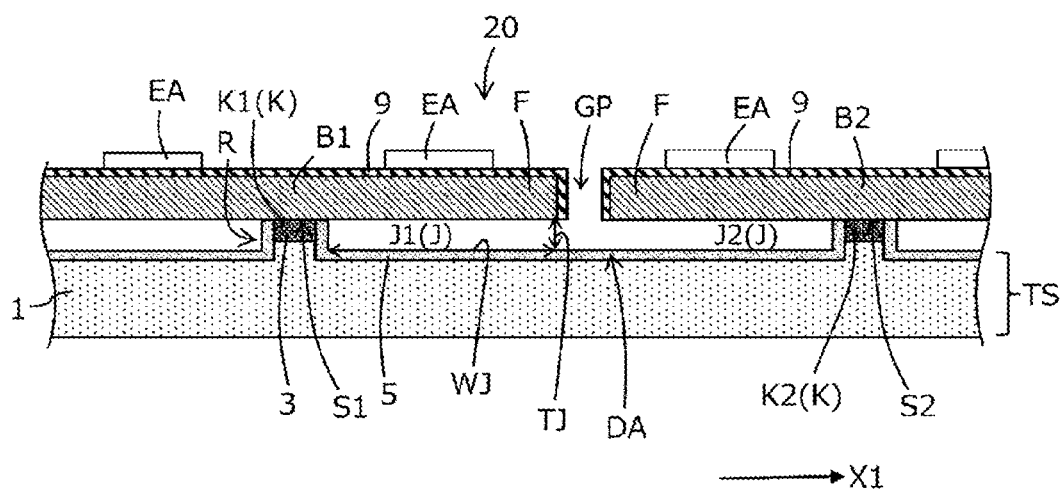
FIG. 17 is a cross-sectional view of the semiconductor substrate including the upper layer part.

FIG. 16 is a plan view of a semiconductor substrate including an upper layer part. FIG. 17 is a cross-sectional view of the semiconductor substrate including the upper layer part. The upper layer part 9 may be formed on the semiconductor part 8 by changing the film-forming conditions (for example, lowering the film-forming temperature by about 100° C.) after the growth of the semiconductor part 8 is stopped. The upper layer part 9 may include at least one selected from the group consisting of a p-type layer, an n-type layer, and an electron block layer, in addition to the active layer. Even when the upper layer part 9 is formed on the semiconductor substrate 10, the phenomenon of wrapping around to the back side in which the material of the upper layer part is supplied to the back surface side of the semiconductor part 8 is greatly suppressed, and problems such as light absorption caused by the phenomenon of wrapping around to the back side are also solved.

In the semiconductor substrate 10 illustrated in FIG. 16 and FIG. 17, an anode EA and a cathode EC are formed above the wing F of the semiconductor part 8. In a typical LED, an active region (light emitting region) is formed immediately below the anode EA constituted by a transparent electrode such as ITO (indium tin oxide). In Example 1, a problem that light emitted from the active region is absorbed at the back surface of the wing F is solved because the phenomenon of wrapping around to the back side is suppressed. At least a part of the anode EA may be positioned above the wing F, or the entire anode EA may be positioned above the wing F. The cathode EC may be formed above the ridge part R because a region directly below the cathode is generally not an active region. Although the anode EA and the cathode EC are formed above the same wing F in FIG. 16 and FIG. 17, the configuration is not limited thereto. As illustrated in FIG. 8, the anode EA may be formed above one of the two wings F facing each other across the ridge part R, and the cathode EC may be formed above the other wing F.

In a known ELO method, cracks may be generated in the semiconductor layer due to a difference in thermal expansion coefficient between the heterogeneous substrate and the semiconductor layer. On the other hand, in Example 1, an internal stress is effectively relaxed and the occurrence of cracks is suppressed while the heterogeneous substrate (a S1 substrate, a SiC substrate, or the like) is used due to the two points that the adjacent semiconductor parts 8 do not meet each other (with the gap GP) and that the semiconductor part 8 is positioned over the void space and physically separated from the mask part 5. Increasing the width of the wing F (for example, to 7 μm or more) can achieve stress relaxation by the wing F.

In Example 1, the width WJ of the void space J is 20 μm, the ridge height is 300 nm, and the width of the gap GP is 10 μm. Since the back surface of the semiconductor part 8 is at the same level as the upper surface of the ridge part R, a thickness of the void space J is 300 nm, and an aspect ratio of the void space J is 66.6. Although the upper layer part 9 was formed on the semiconductor part 8, the lamination of the material of the active layer and the like on the back surface of the semiconductor part 8 was not confirmed, and the fact that the phenomenon of wrapping around to the back side was suppressed was found.

The width WR of the ridge part R serving as the starting point of the growth may be 1 μm to 20 μm, or 2 μm to 10 μm. The thickness TJ of the void space may be equal to or less than 5 μm, equal to or less than 2 μm, equal to or less than 1 μm, equal to or less than 0.6 μm, or equal to or less than 0.3 μm. The thickness TJ of the void space may be equal to or more than 0.05 μm (50 nm). This makes it possible to easily remove the mask part 5. The pitch PR of the ridge part may be equal to or more than 20 μm. An aspect ratio of the void space J can be equal to or more than 5.0, equal to or more than 10, equal to or more than 20, equal to or more than 30, equal to or more than 50, or equal to or more than 100. In this way, the upper layer part 9 is formed on the wide wing F while the phenomenon of wrapping around to the back side is being suppressed, and a semiconductor element with high quality (for example, with high light extraction efficiency) can be formed. The aspect ratio of the void space J may be, for example, 100 to 1000. This reduces the possibility that the semiconductor part 8 may be warped in the upward direction due to gravity. Setting the width of the gap GP to be equal to or less than 30 μm or equal to or less than 10 µm can more effectively suppress the phenomenon of wrapping around to the back side.

Figure 18:
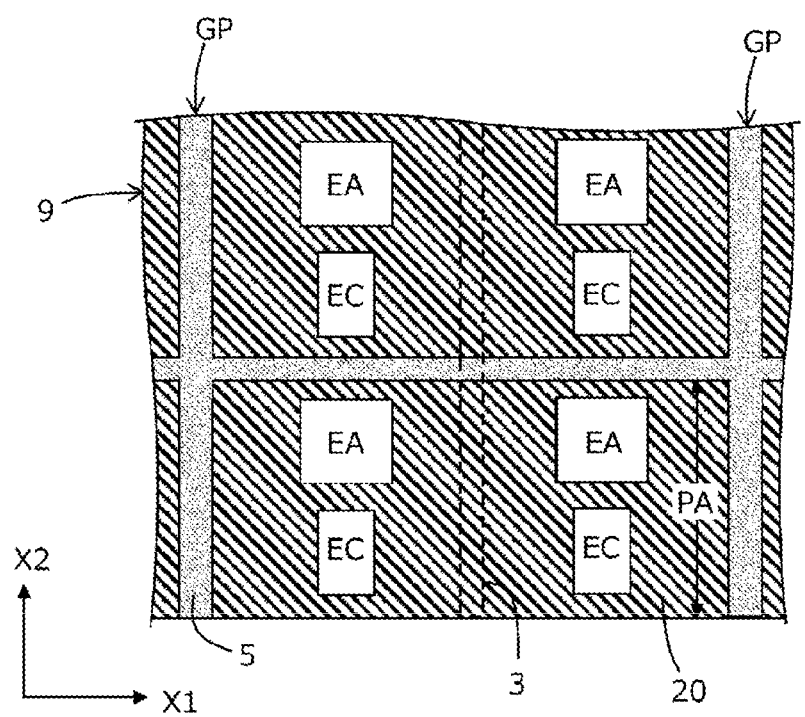
FIG. 18 is a plan view illustrating a method of element isolation in Example 1.
Figure 19:
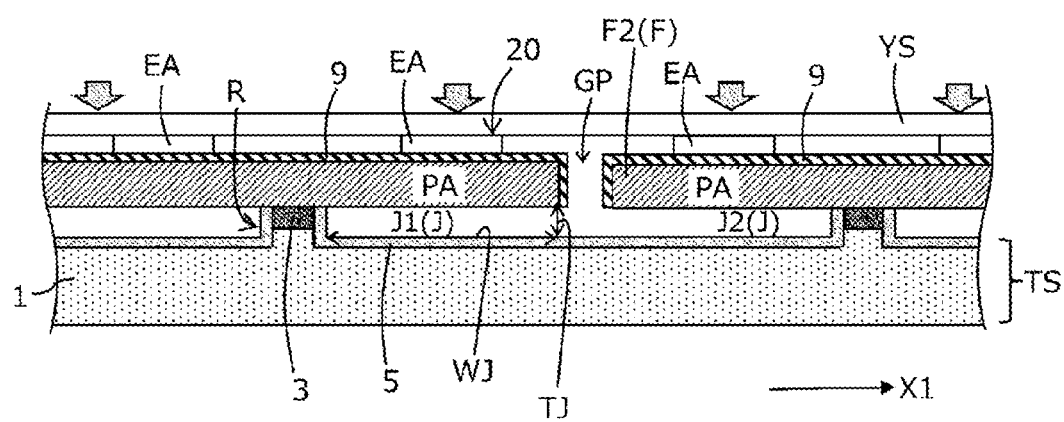
FIG. 19 is a cross-sectional view illustrating the method of the element isolation in Example 1.

FIG. 18 is a plan view illustrating a method of element isolation in Example 1. FIG. 19 is a cross-sectional view illustrating the method of the element isolation in Example 1. As illustrated in FIG. 18 and FIG. 19, an element body 20 (including the wing F, the upper layer part 9, the anode EA, and the cathode EC) is separated from the template substrate. Since the void space J under the wing F is present, applying a downward pressure to the element body 20 with a pressing body YS (an adhesive plate, an adhesive sheet, or the like) having an adhesive property easily breaks a root portion of the element body 20 (a portion connected to the template substrate TS), and separates the element body 20 from the template substrate TS. Specifically, the element body 20 is peeled off from the template substrate TS while being held by the pressing body YS. As described above, the void space J effectively functions also in the separation of the element body, and the element body 20 can be peeled off without damaging the element body 20.

Specific examples of the element body 20 include a light emitting diode (LED), a semiconductor laser, a Schottky diode, a photodiode, and transistors (including a power transistor and a high electron mobility transistor).

Figure 20:
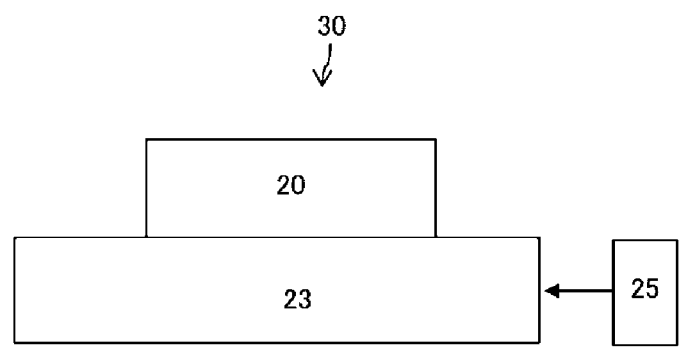
FIG. 20 is a schematic view illustrating a configuration of an electronic device according to Example 1.

FIG. 20 is a schematic diagram illustrating a configuration of an electronic device according to Example 1. An electronic device 30 includes the element body 20, a drive substrate 23 on which the element body 20 is mounted, and a control circuit 25 that controls the drive substrate 23. The control circuit 25 may include a processor. Examples of the electronic device 30 include display devices, laser emitting devices (including a Fabry-Perot type and a surface emitting type), lighting devices, communication devices, information processing devices, sensing devices, and electrical power control devices.

In FIG. 20, the element body 20 is bonded and electrically connected to the drive substrate 23 while being peeled off from the template substrate TS, but may be bonded and electrically connected to the drive substrate 23 while not being peeled off (the template substrate TS and the element body 20 thereon).

Example 2

In Example 2, the semiconductor substrate 10 in FIG. 3 was formed. To be more specific, a silicon substrate is used as the main substrate 1, an Al layer (not illustrated) is formed on the main substrate 1 in a size of 3 nm, and then, an AlN layer having a thickness of 200 nm is film-formed as the buffer part 2 by using a sputtering method. A film-forming temperature is 400° C., and a mixed gas of argon gas and nitrogen gas is used. A gas ratio was about 1:1, an input electrical power was 500 W, and a back pressure during film formation was 0.3 Pa. Then, a 400 nm thick GaN layer serving as the seed part 3 was formed on the buffer part 2 (AlN layer) by a sputtering method by using a GaN target. Thereafter, the ridge part R and a SiN film were formed by the above-described method, and the SiN film on the ridge part was lifted off to obtain the template substrate TS (selective growth substrate) including the mask pattern 6. A bottom surface of the ridge part R reaches the main substrate 1, and the main substrate 1 is dug down by about 400 nm. After that, the semiconductor part 8 is formed on the template substrate TS by using the MOCVD method.

In Example 2, a height of the ridge part R is 200 nm (a thickness of the AlN layer)+400 nm (a thickness of the GaN layer)+400 nm (a depth of digging down of the main substrate)=1000 nm (1.0 µm). A width of the ridge part R was 3 µm, a pitch width of the ridge part was 40 µm, a width of the gap GP was 5 µm, and the width WJ of the void space J was 16 µm. Since the upper surface of the ridge part R and the back surface of the semiconductor part 8 were at the same height, the thickness TJ of the void space J was 1 µm, and an aspect ratio of the void space J was 16.0.

In Example 2, by changing the film-forming conditions of the ELO method (for example, by changing partial pressures of nitrogen and hydrogen in a gas flow and increasing an amount of hydrogen), the configuration illustrated in FIG. 4 in which the height of the back surface of the wing F is lowered from the upper surface of the ridge part R can be obtained. In this case, since the film formation was completed at a position where the back surface of the wing F was lower than the upper surface of the ridge part R by about 600 nm, the void space J had the thickness TJ of 400 nm. A width of the ridge part R was 8 µm, a pitch width of the ridge part was 78 µm, and a width of the gap GP was 30 µm. Thus, the width WJ of the void space J was 20 µm, and an aspect ratio of the void space J was 50.

Example 3

In Example 3, the semiconductor substrate 10 in FIG. 2 was formed. To be more specific, a sapphire substrate is used as the main substrate 1, and an AlN layer having a thickness of 200 nm is film-formed as the seed part 3 on the main substrate 1 by a sputtering method. The film-forming temperature is 500° C., and a mixed gas of argon gas and nitrogen gas is used. A gas ratio was about 1:1, an input electrical power was 500 W, and a back pressure during film formation was 0.3 Pa. Thereafter, the ridge part R and a SiN film were formed by the above-described method, and the SiN film on the ridge part was lifted off to obtain the template substrate TS (selective growth substrate) including the mask pattern 6. The bottom surface of the ridge part R reaches the main substrate 1 (sapphire substrate), and the main substrate 1 is dug down by about 10 nm. Thereafter, the semiconductor part 8 was formed on the template substrate TS by using the MOCVD method.

In Example 3, a height of the ridge part R is 200 nm (a thickness of the AlN layer)+10 nm (a depth of digging down of the main substrate)=210 nm. A width of the ridge part R was 2 µm, a pitch width of the ridge part was 30 µm, a width of the gap GP was 2 µm, and the width WJ of the void space J was 13 µm. Since the upper surface of the ridge part R and the back surface of the semiconductor part 8 were at the same height, the thickness TJ of the void space J was 200 nm, and an aspect ratio of the void space J was 65. Although the upper layer part 9 was formed on the semiconductor part 8, the lamination of the material of the active layer and the like on the back surface of the semiconductor part 8 was not confirmed, and the fact that the phenomenon of wrapping around to the back side was suppressed was found.

Example 4

Figure 21:
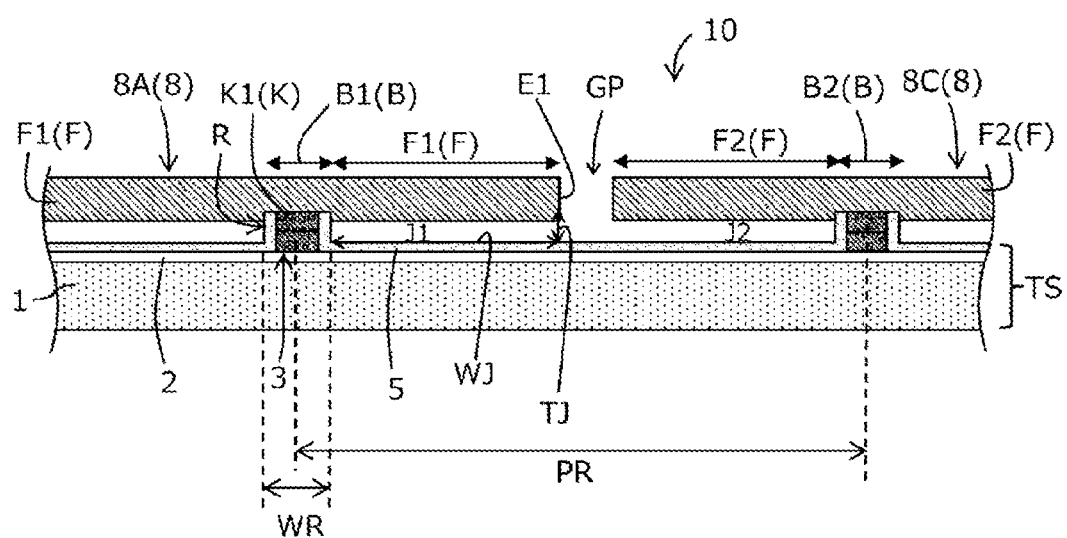
FIG. 21 is a cross-sectional view illustrating a configuration of a semiconductor substrate according to Example 4.

FIG. 21 is a cross-sectional view illustrating a configuration of a semiconductor substrate according to Example 4. In Example 4, in the template substrate TS, the seed part 3 having a two-layer structure of an AlGaN layer (2 µm) and a GaN layer (1.5 µm) was formed on an AlN layer (200 nm) serving as the buffer part 2 by the MOCVD method. The height of the ridge part R is 300 nm, and the bottom surface of the ridge part R is in the GaN layer (the lower layer of the seed part 3). The semiconductor part 8 was formed on the template substrate TS by using the MOCVD method.

In Example 4, the width WR of the ridge part R was 3 µm, the pitch width PR of the ridge part was 55 µm, a width of the gap GP was 10 µm, and the width WJ of the void space J was 21 µm. The back surface of the wing F was about 50 nm lower than the upper surface of the ridge part R, and the thickness TJ of the void space J was 250 nm, so that the aspect ratio of the void space J was 84.

Figure 22:
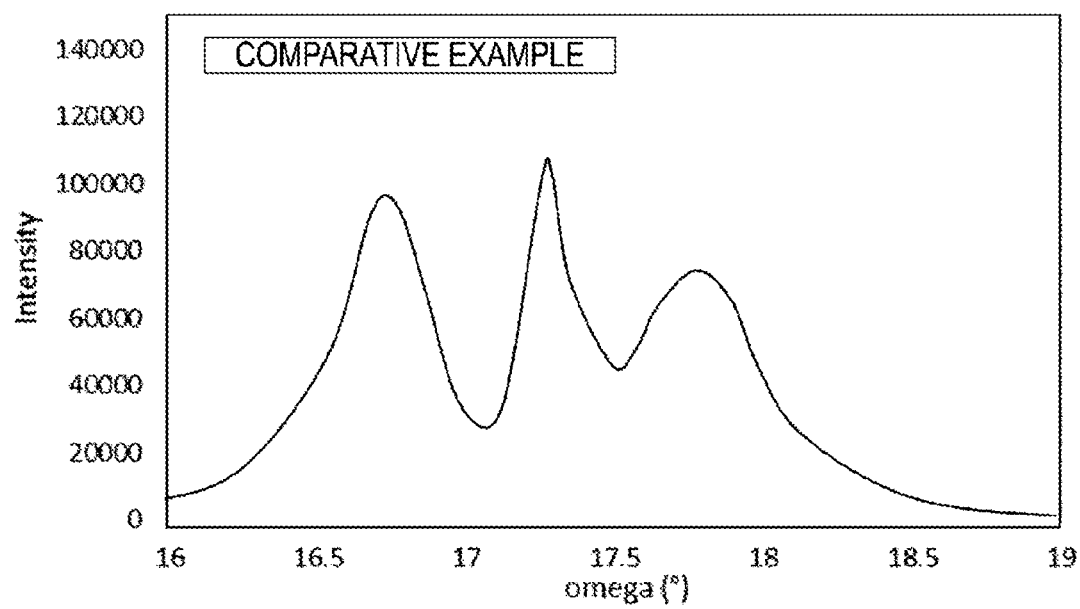
FIG. 22 is a graph showing a result of XRD reflection scan measurement for the ELO layer according to the comparative example.
Figure 23:
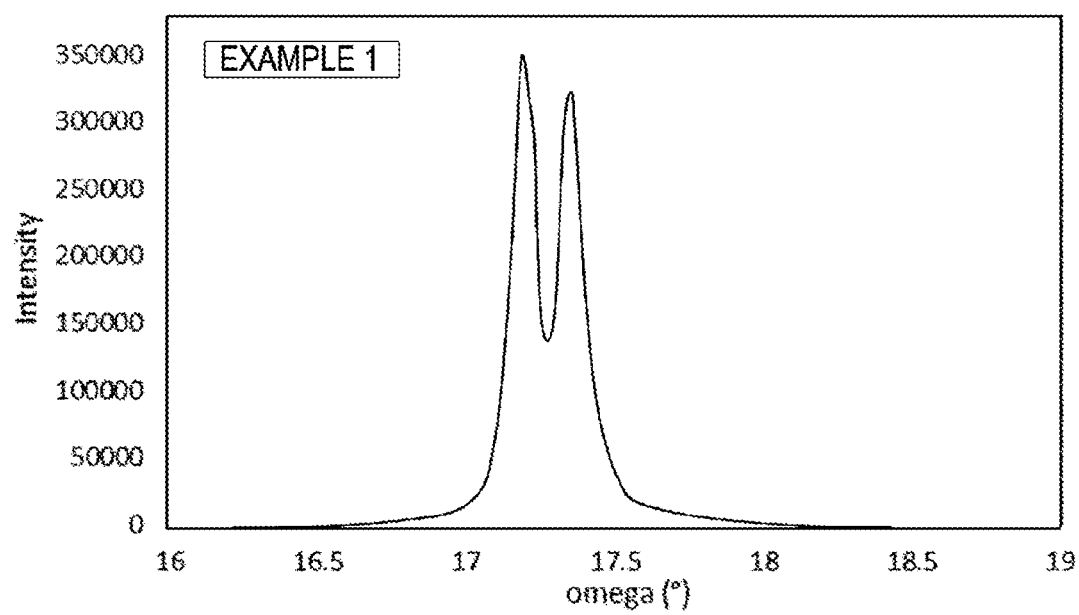
FIG. 23 is a graph showing a result of XRD reflection scan measurement on the semiconductor part according to Example 1.

FIG. 22 is a graph showing a result of XRD reflection scan measurement for the ELO layer according to the comparative example. The ELO layer according to the comparative example was laterally grown to come into contact with a mask part. FIG. 23 is a graph showing a result of XRD reflection scan measurement for the semiconductor part according to Example 1. In FIG. 22, three peaks corresponding to the base and both wings (paired wings) interposing the base are detected. The central peak is the peak of the base, and the crystal axis of the c-plane (c-axis) is substantially perpendicular to the surface of the mask part. In FIG. 22, an angle difference A between the peaks from both the wings was 1.1 degrees. From this result, in the comparative example, the c-axes of both the wings are shifted from the center to the opposite sides to each other by about 0.5 degrees. Such inclinations of the c-axes indicate low flatness of the ELO layer. On the other hand, in FIG. 23, an angle difference A between the peaks from both the wings was 0.17 degrees, which was equal to or less than one fifth that of the comparative example. This result indicated that the flatness of the semiconductor part 8 was significantly improved in Example 1 as compared with the comparative example. Also in another example, a value of Δ=0.2 degrees or less was obtained. This may be because the wing F is grown on the void space J and the gap GP is formed without meeting the adjacent semiconductor parts 8 with each other. Such favorable flatness can be obtained in the wide wing F (for example, 7 µm or more), and in the formation of the upper layer part 9 (for example, see FIG. 17), the take-in of In (indium) is made uniform in a plane, and the quality (for example, light emission efficiency) and the yield of the element body 20 are significantly improved.

Supplementary Note

The foregoing disclosure has been presented for purposes of illustration and description, and not limitation. It is noted that many variations will be apparent to those skilled in the art based on these illustrations and descriptions, and these variations are included in the embodiments.

REFERENCE SIGNS

1 Main substrate
2 Buffer part
3 Seed part
5 Mask part
6 Mask pattern
8A First semiconductor part
8C Second semiconductor part
10 Semiconductor substrate
20 Element body
50 Manufacturing apparatus of semiconductor substrate
R Ridge part
E1 Edge
B1 First base
B2 Second base
F1 First wing
F2 Second wing
J1 First void space
J2 Second void space
S1 First seed region
S2 Second seed region
DA Growth restricting region
TS Template substrate

The invention claimed is:

1. A semiconductor substrate comprising:
a template substrate comprising a first seed region, a growth restricting region, and a second seed region that are aligned in a first direction in a plan view;
a first semiconductor part that is positioned above the template substrate and connected to the first seed region; and
a second semiconductor part that is positioned above the template substrate and connected to the second seed region,
wherein
the first semiconductor part comprises (i) a first base, which is in contact with the template substrate and defined by a vertically extending section of the first semiconductor part that contacts the template substrate, and (ii) a first wing which is not in contact with the template substrate, is adjacent to the first base, and extends from the first base in the first direction,
the first wing comprises a wing edge which is positioned above and suspended over the growth restricting region and is spaced apart from the second semiconductor part by a gap interposed between the wing edge and the second semiconductor part,
the gap being configured to prevent physical contact between the first wing and the second semiconductor part,
the growth restricting region comprises a top surface on an upper side of the template substrate, the top surface having a first portion that faces the first wing, and
a first ratio, which is defined by a width of the first wing in the first direction divided by a shortest vertical distance from the first portion of the top surface of the growth restricting region to the wing edge, is equal to or larger than 5.0.

2. The semiconductor substrate according to claim 1, wherein a width of the gap in the first direction is larger than the shortest vertical distance from the first portion of the top surface of the growth restricting region to the wing edge.

3. The semiconductor substrate according to claim 2, wherein
the width of the first wing in the first direction is equal to or larger than 7.0 µm.

4. The semiconductor substrate according to claim 1, wherein
the second semiconductor part comprises (i) a second base, which is in contact with the template substrate and defined by a vertically extending section of the second semiconductor part that contacts the template substrate, and (ii) a second wing which is not contact with the template substrate, is adjacent to the second base, and extends from the second base in the first direction.

5. The semiconductor substrate according to claim 1, wherein
the template substrate comprises a ridge part on an upper surface side, and
the first seed region is positioned on an upper surface of the ridge part.

6. The semiconductor substrate according to claim 1, wherein
a second ratio, which is defined by the width of the first wing in the first direction divided by a width of the first base in the first direction, is equal to or larger than 3.0.

7. The semiconductor substrate according to claim 1, wherein
a thickness of the first wing and a thickness of the first base are equal.

8. The semiconductor substrate according to claim 1, wherein
a thickness of the first wing is larger than a thickness of the first base.

9. The semiconductor substrate according to claim 1, wherein
the shortest vertical distance from the first portion of the top surface of the growth restricting region to the wing edge is equal to or smaller than 3.0 µm.

10. The semiconductor substrate according to claim 1, wherein
each of the first seed region and the growth restricting region has a shape that extends in a longitudinal direction, the longitudinal direction being a second direction orthogonal to the first direction.

11. The semiconductor substrate according to claim 1, wherein
the template substrate comprises
a main substrate having a lattice constant different from a lattice constant of the first semiconductor part, and
a seed part.

12. The semiconductor substrate according to claim 11, wherein
the main substrate is a silicon substrate, a sapphire substrate, or a silicon carbide substrate, and
the first semiconductor part comprises a nitride semiconductor.

13. The semiconductor substrate according to claim 11, wherein
the template substrate comprises
a mask pattern including a mask part functioning as the growth restricting region, and
an opening portion functioning as the first seed region.

14. The semiconductor substrate according to claim 13, wherein
the template substrate comprises a ridge part on an upper surface side, and
the ridge part comprises the seed part.

15. The semiconductor substrate according to claim 14, wherein
the seed part is not disposed under the mask part.

16. The semiconductor substrate according to claim 14, wherein
an upper surface of the ridge part is formed by the seed part, and
a side surface of the ridge part is formed by the mask part.

17. The semiconductor substrate according to claim 14, wherein
the main substrate comprises a protruding portion on the upper surface side, and
the seed part is positioned on the protruding portion.

18. The semiconductor substrate according to claim 14, wherein
the ridge part is positioned on an upper surface of the main substrate, the upper surface being flat.

19. The semiconductor substrate according to claim 16, wherein
the side surface of the ridge part is in contact with the first base.

20. The semiconductor substrate according to claim 13, wherein
a thickness of the mask part is equal to or smaller than 50 nm.

21. The semiconductor substrate according to claim 12, wherein
the nitride semiconductor is a GaN-based semiconductor, and
the first ratio is equal to or larger than 20.0.

22. The semiconductor substrate according to claim 1, wherein
the first semiconductor part comprises a pair of two first wings extending from the first base individually in the first direction and in a direction opposite to the first direction.

23. The semiconductor substrate according to claim 1, further comprising:
an upper layer part positioned above the first semiconductor part, the upper layer part comprising an active layer and a p-type layer.

24. The semiconductor substrate according to claim 11, wherein
an upper surface of the seed part is the first seed region,
a side surface of the seed part is covered with a same material as a material of the growth restricting region.

25. The semiconductor substrate according to claim 1, wherein
a third ratio, which is defined by the width of the first wing in the first direction divided by a thickness of the first wing in a direction orthogonal to the first direction, is equal to or larger than 5.0.

* * * * *